United States Patent
Zinn

(10) Patent No.: US 9,624,091 B2
(45) Date of Patent: Apr. 18, 2017

(54) TRAPPED MEMBRANE

(71) Applicant: Robert Bosch GmbH, Stuttgart (DE)

(72) Inventor: John W. Zinn, Canonsburg, PA (US)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 14/894,391

(22) PCT Filed: Jun. 2, 2014

(86) PCT No.: PCT/US2014/040503
§ 371 (c)(1),
(2) Date: Nov. 27, 2015

(87) PCT Pub. No.: WO2014/194316
PCT Pub. Date: Dec. 4, 2014

(65) Prior Publication Data
US 2016/0122177 A1    May 5, 2016

Related U.S. Application Data

(60) Provisional application No. 61/829,550, filed on May 31, 2013.

(51) Int. Cl.
*B81B 3/00* (2006.01)
*H04R 19/01* (2006.01)

(52) U.S. Cl.
CPC .... *B81B 3/0051* (2013.01); *B81B 2201/0257* (2013.01); *B81B 2203/0127* (2013.01); *H04R 19/016* (2013.01); *H04R 2201/003* (2013.01)

(58) Field of Classification Search
CPC ... B81B 1/00; B81B 2201/00; B81B 2201/02; H04R 1/00; H04R 3/00
See application file for complete search history.

(56) References Cited

U.S. PATENT DOCUMENTS

| | | | | |
|---|---|---|---|---|
| 5,111,693 A | * | 5/1992 | Greiff | B81B 3/0051 73/514.35 |
| 5,870,482 A | | 2/1999 | Loeppert et al. | |
| 6,649,989 B2 | * | 11/2003 | Benzel | B81B 3/007 148/33.2 |
| 7,148,077 B2 | * | 12/2006 | Fuertsch | B81B 3/007 257/419 |

(Continued)

FOREIGN PATENT DOCUMENTS

| | | |
|---|---|---|
| EP | 0561566 A2 | 9/1993 |
| WO | 2013061298 A2 | 5/2013 |

OTHER PUBLICATIONS

International Search Report and Written Opinion for Application No. PCT/US2014/040503 dated Jun. 2, 2014, 11 pages.

*Primary Examiner* — Calvin Choi
*Assistant Examiner* — S. M. S Imtiaz
(74) *Attorney, Agent, or Firm* — Michael Best & Friedrich LLP

(57) ABSTRACT

A MEMS trapped membrane. The MEMS trapped membrane includes a first layer and a second structure. The first layer has an outer section and an inner membrane. The outer section and inner membrane are detached from each other by a separation, and have inner membrane protrusions and outer section protrusions formed by the separation. The second structure is coupled to the outer section and has second protrusions that overlay corresponding inner membrane protrusions.

14 Claims, 3 Drawing Sheets

(56) References Cited

U.S. PATENT DOCUMENTS

| | | | |
|---|---|---|---|
| 7,306,966 B2* | 12/2007 | Benzel | G01L 9/0042 216/2 |
| 7,834,409 B2* | 11/2010 | Reichenbach | B81C 1/00182 257/419 |
| 8,045,733 B2 | 10/2011 | Zhe et al. | |
| 8,067,769 B2* | 11/2011 | Okudo | B81C 1/00269 257/254 |
| 8,207,585 B2* | 6/2012 | Schlosser | B81C 1/00158 257/415 |
| 8,284,964 B2 | 10/2012 | Windischberger et al. | |
| 8,558,327 B2* | 10/2013 | Knese | B81B 3/0086 257/414 |
| 8,625,823 B2 | 1/2014 | Buck | |
| 8,698,255 B2* | 4/2014 | Reichenbach | B81B 3/0008 257/416 |
| 8,816,453 B2* | 8/2014 | Zoellin | H04R 19/04 257/416 |
| 2005/0217373 A1* | 10/2005 | Ishikawa | B81B 3/0051 73/493 |
| 2006/0140431 A1* | 6/2006 | Zurek | H04R 3/005 381/355 |
| 2006/0280319 A1 | 12/2006 | Wang et al. | |
| 2007/0047046 A1* | 3/2007 | Ji | B81B 3/007 359/224.1 |
| 2008/0031476 A1* | 2/2008 | Wang | B81B 3/0051 381/174 |
| 2009/0060232 A1 | 3/2009 | Hirade et al. | |
| 2010/0278372 A1* | 11/2010 | Zhang | H04R 1/222 381/412 |
| 2012/0025333 A1* | 2/2012 | Yoshida | B81C 1/00587 257/415 |
| 2012/0091544 A1 | 4/2012 | Reichenbach | |
| 2012/0319219 A1* | 12/2012 | Diamond | H04R 19/005 257/416 |
| 2013/0016859 A1 | 1/2013 | Buck | |
| 2013/0334626 A1* | 12/2013 | Weber | B81B 3/0018 257/416 |
| 2015/0253265 A1* | 9/2015 | Whitten | G01N 25/20 506/9 |

\* cited by examiner

US 9,624,091 B2

TRAPPED MEMBRANE

RELATED APPLICATION

The present patent application claims the benefit of prior filed U.S. Provisional Patent Application No. 61/829,550, filed on May 31, 2013, the entire content of which is hereby incorporated by reference.

BACKGROUND

The present invention relates to a membrane for a MEMS microphone. Specifically, the invention relates to a structure for trapping a membrane of a MEMS microphone using two or more layers.

SUMMARY

In one embodiment, the invention provides a MEMS trapped membrane. The MEMS trapped membrane includes a first layer and a second structure. The first layer has an outer section and an inner membrane. The outer section and inner membrane are detached from each other by a separation, and have inner membrane protrusions and outer section protrusions formed by the separation. The second structure is coupled to the outer section and has second protrusions that overlay corresponding inner membrane protrusions.

DETAILED DESCRIPTION

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways.

In general, a MEMS microphone consists of a first layer moving membrane and an opposite perforated counter electrode element (backplate), which may consist of a single conductive layer or a composite structure including a conductive layer and additional conductive or non-conductive layers. The trapped membrane described herein can be formed by depositing additional layers opposite one of both faces of the membrane. These additional layers may serve a variety of purposes related to microphone performance, not limited to improving mechanical robustness by serving as an over travel stop (i.e. limiting the motion of the membrane to prevent breakage) or serving as an acoustic leak control feature (i.e. creating a longer or narrower air path around the membrane) to control the low frequency response of the microphone system. In some embodiments, one or more of the layers comprising the counter electrode element (backplate) may be used to perform the function of trapping the membrane and providing the benefits of an overtravel stop and/or acoustic leak control feature.

Figure 1A:
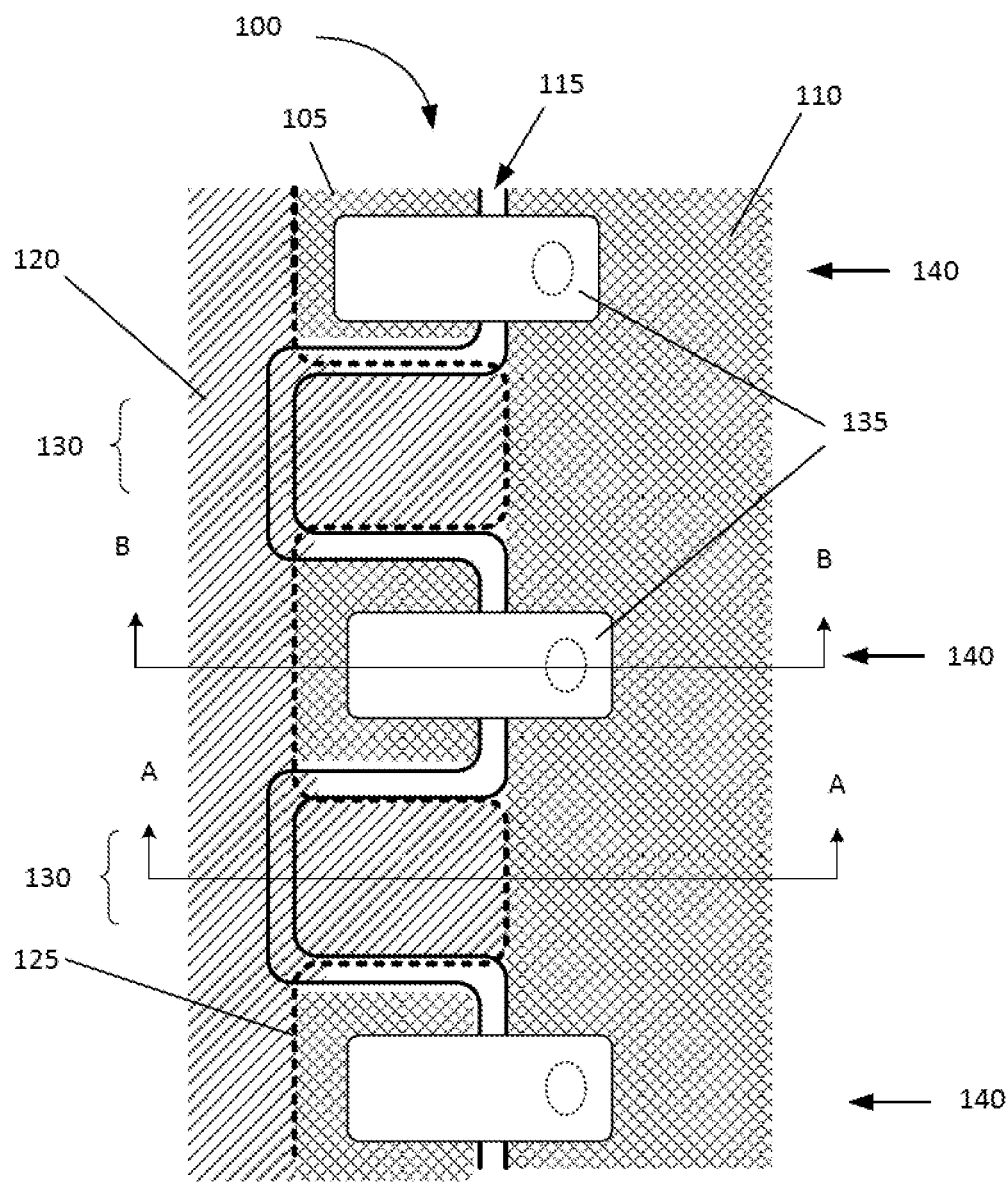
FIG. 1A is a schematic view of section of a trapped membrane of a MEMS microphone.

FIG. 1A shows a construction of a trapped membrane 100 of a MEMS microphone. A first layer has an outer section 105 an inner membrane 110, and a separation 115. The separation 115 has a serpentine shape and can be formed by any suitable method (e.g., etching, etc.). A second layer 120 has a serpentine edge 125 that overlays in part or in whole the corresponding serpentine protrusions on the inner membrane 110. The second layer 120 is positioned a distance from the membrane 110 and extends over the membrane 110 at points 130. In some constructions, the second layer 120 is directly attached to the outer section 105. In other constructions, the second layer 120 is attached to the outer section 105 using one or more connecting layers which also set the spacing between the first and second layer.

Figure 1B:
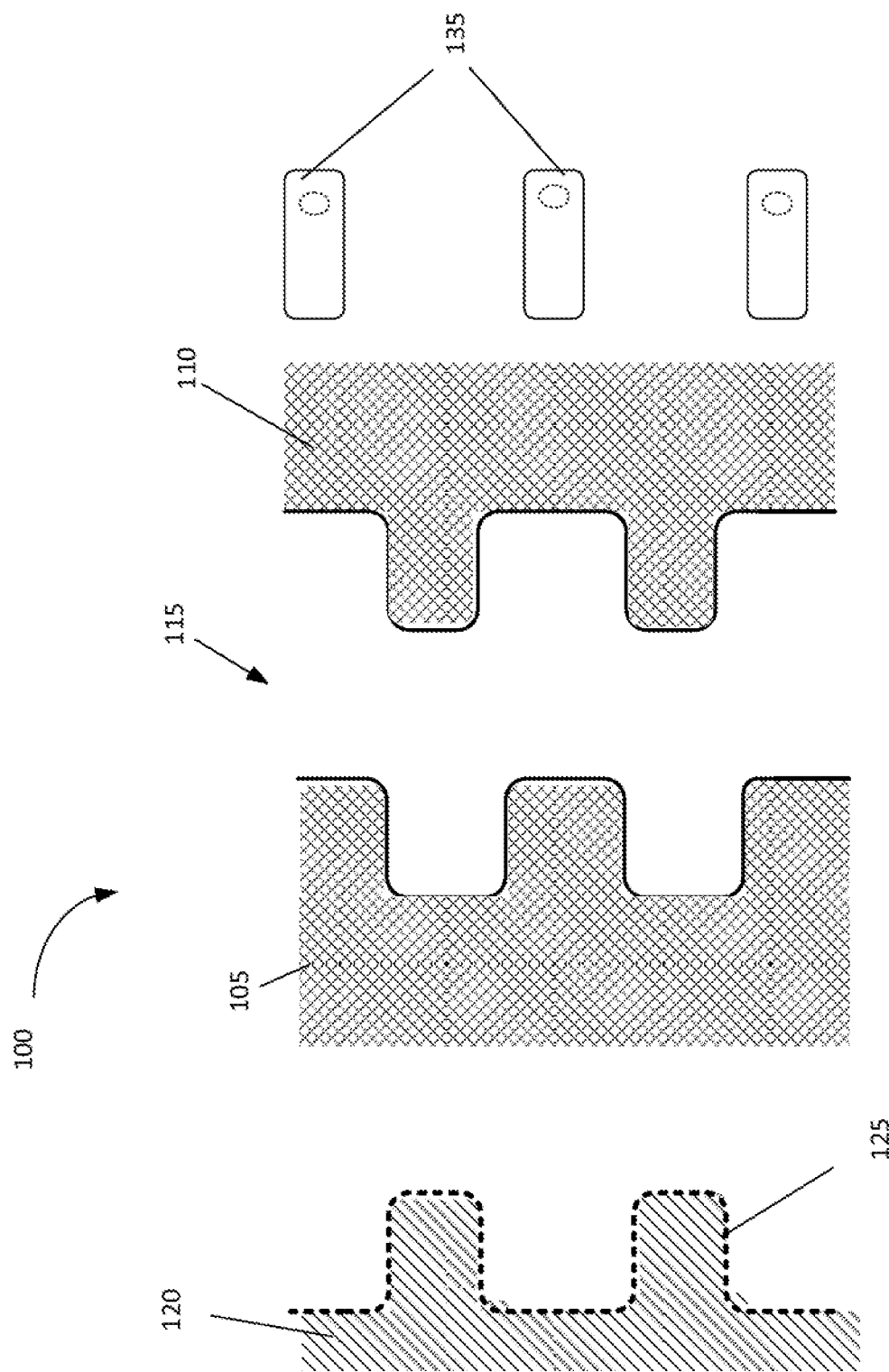
FIG. 1B is a separated view of the trapped membrane shown in FIG. 1.

The second layer 120 forms a first over-travel stop (OTS) for limiting the distance the membrane 110 can move in a first direction. A plurality of tabs 135 are coupled to the membrane 110 at points 140, and extend over the outer section 105. The tabs 135 form a second OTS for limiting the distance the membrane 110 can move in a second direction. The second direction is 180° from the first direction. FIG. 1B shows the components of FIG. 1A separated out for clarity.

Figure 2A:
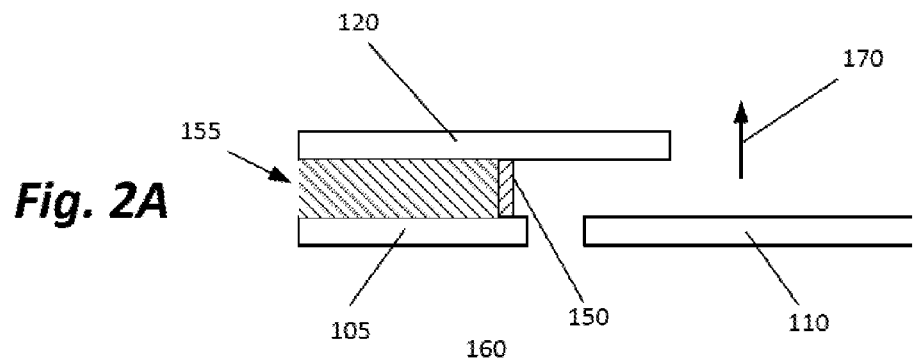
FIG. 2A is a cut-away view of a first over-travel stop structure of the trapped membrane shown in FIG. 1.
Figure 2B:
FIG. 2B is an alternative construction of the first over-travel stop structure.

FIG. 2A is a cut-away view of the section of the floating membrane 100 labeled AA in FIG. 1. The outer section 105 is anchored to the second layer 120 by one or more connectors 150. In some constructions, the connectors 150 can act as a seal and cause a connecting layer(s) 155 to remain between the second layer 120 and the outer section 105 following processing. FIG. 2B shows an alternative construction of section AA created using traditional MEMS manufacturing techniques. A separate element 160 formed in another material layer is directly attached to the outer section 105 and functions as the first OTS. In the constructions shown in FIGS. 2A and 2B, the second layer 120/ elements 160 extend over the membrane 110 and limit the travel of the membrane in the first direction (represented by arrow 170). The second layer 120 and elements 160 may be formed as periodic, tab shaped structures or may be formed as continuous ring shaped structures, in addition to other embodiments.

Figure 3A:
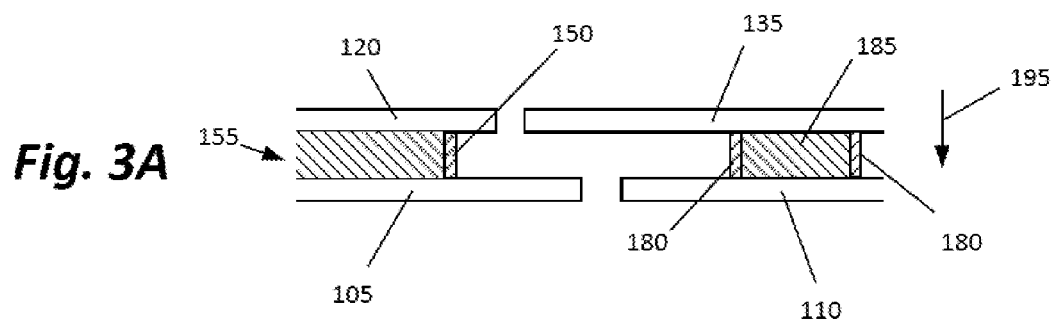
FIG. 3A is a cut-away view of a second over-travel stop structure of the trapped membrane shown in FIG. 1.
Figure 3B:
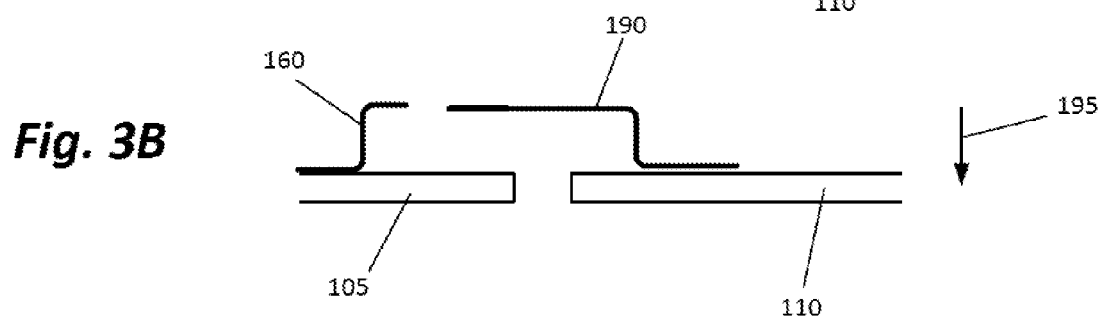
FIG. 3B is an alternative construction of the second over-travel stop structure.

FIGS. 3A and 3B are cut-away views of the section of the floating membrane 100 labeled BB in FIG. 1. In FIG. 3A, the outer section 105 is again anchored to the second layer 120 by one or more connectors 150. In some constructions, the connectors 150 act as a seal and cause a connecting layer(s) 155 to remain between the second layer 120 and the outer section 105 following processing. The tabs 135 are connected to the membrane 110 by one or more connectors 180. In some constructions, the connector(s) 180 act as a seal (e.g., a ring) and cause a connecting layer(s) 185 to remain between the tabs 135 and the membrane 110 following processing. FIG. 3B shows an alternative construction created using MEMS manufacturing techniques. The tabs are a separate element 190 directly attached to the membrane 110. In the constructions shown in FIGS. 3A and 3B, the tabs 135/elements 190 extend over the outer section 105 and limit the travel of the membrane in the second direction (represented by arrow 195).

Alternatively, a third layer positioned on the opposite side of the membrane 110 as the second layer 120 can serve as the second direction OTS. In some constructions, the membrane 110 has no connections (e.g., springs) to relieve any material induced tensile and compressive stresses. However, in some constructions, springs are used to define a specific membrane stiffness. Constructions using a second layer or an optional third layer can also be used to control the acoustic flow resistance around the membrane 110 (e.g. by lengthening the flow path) in order to better control the low frequency performance of the microphone.

Thus, the invention provides, among other things, a MEMS microphone trapped membrane.

What is claimed is:

1. A MEMS trapped membrane, the MEMS trapped membrane comprising:
    a first layer having an outer section and an inner membrane, the outer section and the inner membrane detached from each other by a separation, the inner membrane having inner membrane protrusions and the outer section having outer section protrusions formed by the separation;
    a second structure coupled to the outer section and having second protrusions that overlay the inner membrane protrusions, and
    a plurality of tabs coupled to the inner membrane that overlay the outer section protrusions,
    wherein the plurality of tabs and the second protrusions limit travel of the inner membrane.

2. The MEMS trapped membrane of claim 1, wherein the second structure is a second layer.

3. The MEMS trapped membrane of claim 2, wherein the second structure is anchored to the outer section by one or more connectors.

4. The MEMS trapped membrane of claim 3, wherein the one or more connectors act as a seal, sealing a connecting layer between the one or more connectors.

5. The MEMS trapped membrane of claim 1, wherein the second structure is a second element attached to the outer section using MEMS techniques.

6. The MEMS trapped membrane of claim 1, wherein the separation is serpentine shaped.

7. The MEMS trapped membrane of claim 1, wherein the second structure acts as an overtravel stop for the inner membrane in a first direction.

8. The MEMS trapped membrane of claim 1, wherein the second structure is directly attached to the outer section.

9. The MEMS trapped membrane of claim 1, further comprising a connecting layer separating the second structure from the outer section.

10. The MEMS trapped membrane of claim 1, wherein the plurality of tabs are formed by a second layer.

11. The MEMS trapped membrane of claim 10, wherein the plurality of tabs are anchored to the inner membrane by one or more connectors.

12. The MEMS trapped membrane of claim 11, wherein the one or more connectors act as a seal, sealing a connecting layer between the one or more connectors.

13. The MEMS trapped membrane of claim 1, wherein the plurality of tabs are separate elements attached to the inner membrane using MEMS techniques.

14. The MEMS trapped membrane of claim 1, wherein the plurality of tabs act as overtravel stops for the inner membrane in a second direction.

* * * * *